(12) United States Patent
Fuke et al.

(10) Patent No.: US 6,311,391 B1
(45) Date of Patent: Nov. 6, 2001

(54) FLIP-CHIP BONDING APPARATUS

(75) Inventors: Shigeru Fuke, Musashino; Masaki Yokohama, Musashimurayama; Shigeru Hayata, Tachikawa, all of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/447,997

(22) Filed: Nov. 23, 1999

(30) Foreign Application Priority Data

Nov. 25, 1998 (JP) .................................................. 10-334263

(51) Int. Cl.[7] ...................................................... B23P 19/00
(52) U.S. Cl. ................... 29/740; 29/743; 29/739; 29/721; 29/833; 228/105
(58) Field of Search ........................... 29/740, 739, 721, 29/743, 833, 729; 228/105, 103, 203, 8, 9, 10, 12

(56) References Cited

U.S. PATENT DOCUMENTS

| | | | |
|---|---|---|---|
| 3,946,931 | * 3/1976 | Bahnck et al. | 228/102 |
| 4,899,921 | * 2/1990 | Bendat et al. | 228/105 |
| 5,212,880 | * 5/1993 | Nishiguchi et al. | 29/739 |
| 5,460,320 | * 10/1995 | Belcher et al. | 228/180.22 |
| 5,501,004 | * 3/1996 | Onitsuka | 29/827 |

FOREIGN PATENT DOCUMENTS

| | | |
|---|---|---|
| 2725701 | 12/1997 | (JP) . |
| 10223703 | * 8/1998 | (JP) . |
| 11-297749 | * 10/1999 | (JP) . |
| 2000164640 | * 6/2000 | (JP) . |

* cited by examiner

*Primary Examiner*—Carl J. Arbes
*Assistant Examiner*—Minh Trinh
(74) *Attorney, Agent, or Firm*—Koda & Androlia (57) ABSTRACT

In a flip-chip bonding apparatus, a die inverting device is installed on an optical recognition device so that a vacuum suction chucking nozzle that is provided on the die inverting device can rotate in the direction of a pick-up position and in the direction of a die transfer position in an outside area of an open window of the optical recognition device, so that the bonding apparatus can be compact and has an improved precision of recognition of the amount of positional deviation of the die.

7 Claims, 9 Drawing Sheets

FLIP-CHIP BONDING APPARATUS

BACKGROUND OF THE INVENTION

1. Field of the Invention

The present invention relates to a flip-chip bonding apparatus in which a die (semiconductor chip) is inverted and bonded directly to a substrate.

2. Prior Art

Japanese Patent No. 2725701, for instance, discloses a flip-chip bonding apparatus. In this bonding apparatus, bonding is performed in the following manner:

Numerous dies disposed on a wafer sheet with the bumps (electrodes) facing upward are picked up by a vacuum suction chucking nozzle and thus held by vacuum suction. Next, while holding a die by vacuum suction, the vacuum suction chucking nozzle is rotated in the vertical direction by a die inverting device so that the die is inverted. Then, the die held by the vacuum suction chucking nozzle is received by a bonding nozzle, the bonding nozzle transfers the die to the substrate, and the die is bonded to this substrate.

This prior art does not disclose any means for recognizing the die positioned on the wafer sheet that is to be picked up by the vacuum suction chucking nozzle or a means for correcting positional deviation of the die. However, the following type of structure is generally used therefor.

A die inverting device, which has a vacuum suction chucking nozzle, and an optical recognition device, which is positioned at a fixed offset distance from the vacuum suction chucking nozzle in order to recognize the die on the wafer sheet, are mounted on a universally known XY table and wafer holder. The universally known XY table and wafer holder are respectively driven in the X and Y directions and θ direction. Thus, recognition functions including the distinction between a good die and a defective die and the calculation of positional deviation of a good die, etc. are performed by this optical recognition device.

With the above system, the XY table and wafer holder are driven so that an open window (through which an image of a die is taken) provided on the optical recognition device is moved to a point above the die that is to be picked up. Then, after a die is recognized and the positional deviation of the die is calculated, the XY table and the wafer holder are driven with the offset amount between the optical recognition device and the vacuum suction chucking nozzle and the positional deviation of the die added (offset movement), thus moving the vacuum suction chucking nozzle a point above the die that is to be picked up. In this way, the positional deviation of the die is eliminated. Next, the vacuum suction chucking nozzle is lowered, and the die is picked up from the wafer sheet and held by vacuum suction. Next, while holding the die by vacuum suction, the vacuum suction chucking nozzle is rotated by the die inverting device so that the die is inverted as described above. In order to recognize the die that is to be picked up next, the XY table and wafer holder are driven so that the open window of the optical recognition device is moved to a point above the die that is to be picked up.

In the above-described prior art, the die inverting device and the optical recognition device are independently installed on the XY table and wafer holder. As a result, the overall size of the bonding apparatus becomes large. Also, since the optical recognition device is moved with the offset, mechanical error tends to occur during the positioning of the optical recognition device in the X and Y directions. Moreover, it is necessary to move the open window of the optical recognition device to a point above the next die to be picked up after the die has been picked up by the vacuum suction chucking nozzle and the vacuum suction chucking nozzle has been inverted by the die inverting device. Accordingly, die recognition cannot be performed instantly, and it takes a longer production time.

SUMMARY OF THE INVENTION

Accordingly, the first object of the present invention is to provide a flip-chip bonding apparatus which is reduced in overall size and is improved with the precision of recognition of positional deviation of a die.

The second object of the present invention is to provide a flip-chip bonding apparatus in which the overall bonding time can be shortened, thus improving the productivity.

The above objects are accomplished by a unique structure of the present invention for a flip-chip bonding apparatus which comprises: a vacuum suction chucking nozzle which picks up and holds, by means of vacuum suction, a die disposed on a wafer sheet or tray with bumps of the die facing upward; a die inverting device on which the vacuum suction chucking nozzle is provided and which rotates the vacuum suction chucking nozzle, in a state in which the die is held by vacuum suction, in the direction of a die pick-up position and in the direction of a die transfer position so as to invert the upper surface and undersurface of the die; and an optical recognition device which has an open window formed in its undersurface and recognizes an image of the die disposed on the wafer sheet or tray; and in the present invention, the die inverting device is installed on the optical recognition device so that the vacuum suction chucking nozzle can rotate in the direction of the die pick-up position and in the direction of the die transfer position.

The flip-chip bonding apparatus of the present invention is provided with: a rotating member which is installed on the optical recognition device so that the rotating member is rotatable in a vertical plane, and a driving means which is installed on the optical recognition device and rotates the rotating member; and in addition the vacuum suction chucking nozzle is provided on the rotating member so that the vacuum suction chucking nozzle is moved to positionally correspond to the open window of the optical recognition device.

In this structure, the rotating member is comprised of a first gear, and the driving means comprised of a second gear, which engages with the first gear, and a driving source such as a motor, etc. which rotates the second gear.

Furthermore, in the flip-chip bonding apparatus of the present invention, a rotating member which is installed on the optical recognition device so as to be on the same side as the open window so that the rotating member is rotatable in the vertical plane and movable horizontally, and a driving means which is installed on the optical recognition device and rotates the rotating member, are provided; and the vacuum suction chucking nozzle is provided on the rotating member so as to positionally correspond to the open window.

In addition, the flip-chip bonding apparatus of the present invention is provided with: a slider which is installed on the optical recognition device so as to be near the open window and be rotatable and movable horizontally, and a driving means which is installed on the optical recognition device so as to rotate and horizontally move the slider; and the vacuum suction chucking nozzle is provided on the slider, and the driving means rotates the vacuum suction chucking nozzle in the direction of the die pick-up position and in the direction of the die transfer position and causes the vacuum suction chucking nozzle to positionally correspond to the open window of the optical recognition device.

In this structure, the driving means is comprised of: a first gear which is fastened to the slider, a second gear which engages with this first gear, a first driving source which is installed on the optical recognition device so as to be movable horizontally and to rotate the second gear, and a second driving source which is installed on the optical recognition device so as to move the first driving source horizontally.

Furthermore, the above-described objects are accomplished by still another unique structure of the present invention for a flip-chip bonding apparatus which comprises: a vacuum suction chucking nozzle which picks up and holds, by means of vacuum suction, a die disposed on a wafer sheet or tray with bumps of the die facing upward; and an optical recognition device which has an open window formed in its undersurface and recognizes an image of the die disposed on the wafer sheet or tray; and in the present invention, the optical recognition device is rotatably installed so that the open window thereof is rotatable in the vertical plane, the vacuum suction chucking nozzle is provided on the optical recognition device so as to be positioned within the plane of the rotation of the open window, and a driving means is further provided so as to rotate the optical recognition device.

DETAILED DESCRIPTION OF THE PREFERRED EMBODIMENTS

One embodiment of the present invention will be described with reference to FIGS. 1 through 3.

Numerous dies 3 are provided, with their bumps facing upward, on a wafer sheet 2 which is attached to a wafer ring 1. The wafer ring 1 is positioned and held on a wafer holder 5. The wafer holder 5 is fastened to an XY table 4 that is driven in the X and Y directions, and it rotates the wafer ring 1 in the θ direction by means of a rotary driving means (not shown). A push-up pin 6 is installed beneath the wafer sheet 2 so as to push the dies 3 upward.

A substrate 10, to which each die 3 is bonded, is fed by a feeder (not shown) along guide rails 11 that face each other and installed at a bonding position. Furthermore, a bonding nozzle 12 is provided. The bonding nozzle 12 is to receive each die 3 from the vacuum suction chucking nozzle 35 (described later) and bonds this die 3 to the substrate 10. A vacuum suction hole 12a is formed in this bonding nozzle 12. This vacuum suction hole 12a is connected to a vacuum source (not shown) via a bonding nozzle electromagnetic valve (not shown). The bonding nozzle 12 is driven upward and downward by a vertical driving means (not shown) and is further moved in the X and Y directions by an XY table (not shown).

An optical recognition device 20 which recognizes each die 3 is installed above the wafer holder 5, and a die inverting device 30 is mounted on this optical recognition device 20. The bonding nozzle 12 is installed above the die inverting device 30.

The construction of the optical recognition device 20 will be described first.

An open window 21a is formed in the undersurface of the main body 21 of the optical recognition device 20. Through this open window 21a, each die 3 is irradiated with irradiating light, and an image of the die 3 is taken. A prism 22 is disposed inside the main body 21 of the optical recognition device 20 so as to face the open window 21a; and an image-focusing lens 23, half-mirror 24 and image pick-up element 25 are installed in that order next to the prism 22. An illuminator 26 is provided outside the main body 21 of the optical recognition device 20 so as to positionally correspond to the half-mirror 24. Light is supplied to this illuminator 26 from a light source (not shown) via an optical fiber 27; and this light is directed, via the half-mirror 24, image-focusing lens 23 and prism 22, onto the die 3 that is beneath the open window 21a.

Next, the structure of the die inverting device 30 will be described.

Figure 3A:
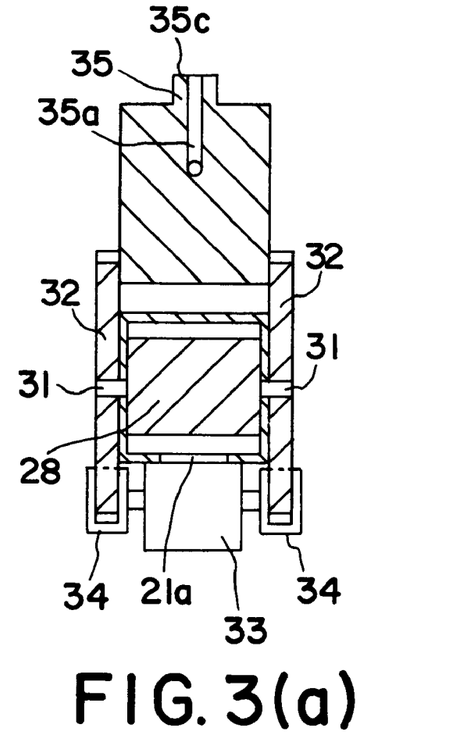
FIG. 3(a) is a cross-sectional view taken along the line 3a—3a in FIG. 1.
Figure 3B:
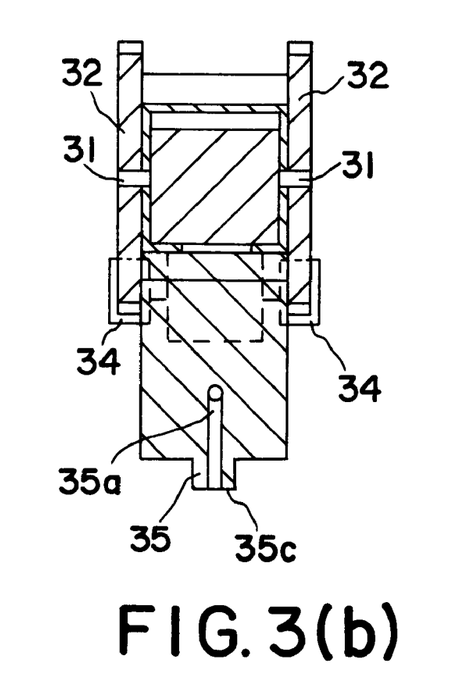
FIG. 3(b) is a cross-sectional view taken along the line 3b—3b in FIG. 2.

As best shown in FIG. 3, supporting shafts 31 are fastened to both side surface portions of the main body 21 of the optical recognition device 20 at the location near the open window 21a, and gears 32 are rotatably mounted on the supporting shafts 31. The supporting shafts 31 are installed so that their axial centers coincide with the center 28a of the optical axis 28 of the optical recognition device 20 shown in FIG. 1.

A driving source 33, a motor, for instance, is mounted on the undersurface of the main body 21 of the optical recognition device 20; and gears 34 which engage with the gears 32 are coupled to the output shafts of this driving source 33. A vacuum suction chucking nozzle 35 is fastened to the gears 32, and a vacuum suction hole 35a is formed in this vacuum suction chucking nozzle 35. One end of a tube 36 (see FIG. 1) is connected to the vacuum suction hole 35a, and the other end of this tube 36 is connected to a vacuum source (not shown) via a vacuum suction chucking nozzle electromagnetic valve (not shown).

Next, the operation of the bonding apparatus will be described.

Figure 1:
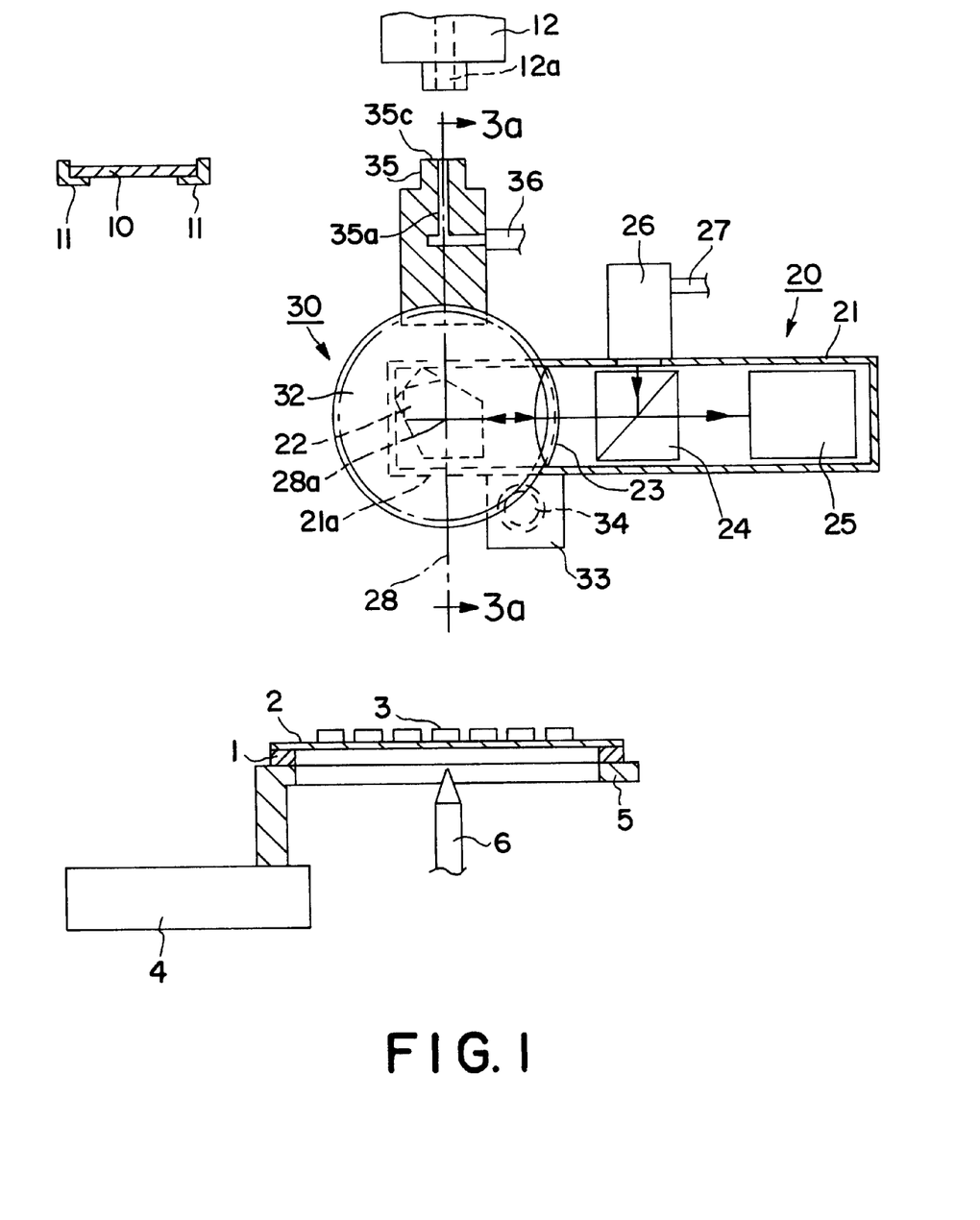
FIG. 1 is a longitudinal cross-sectional view of the flip-chip bonding apparatus according to the first embodiment of the present invention.
Figure 2:
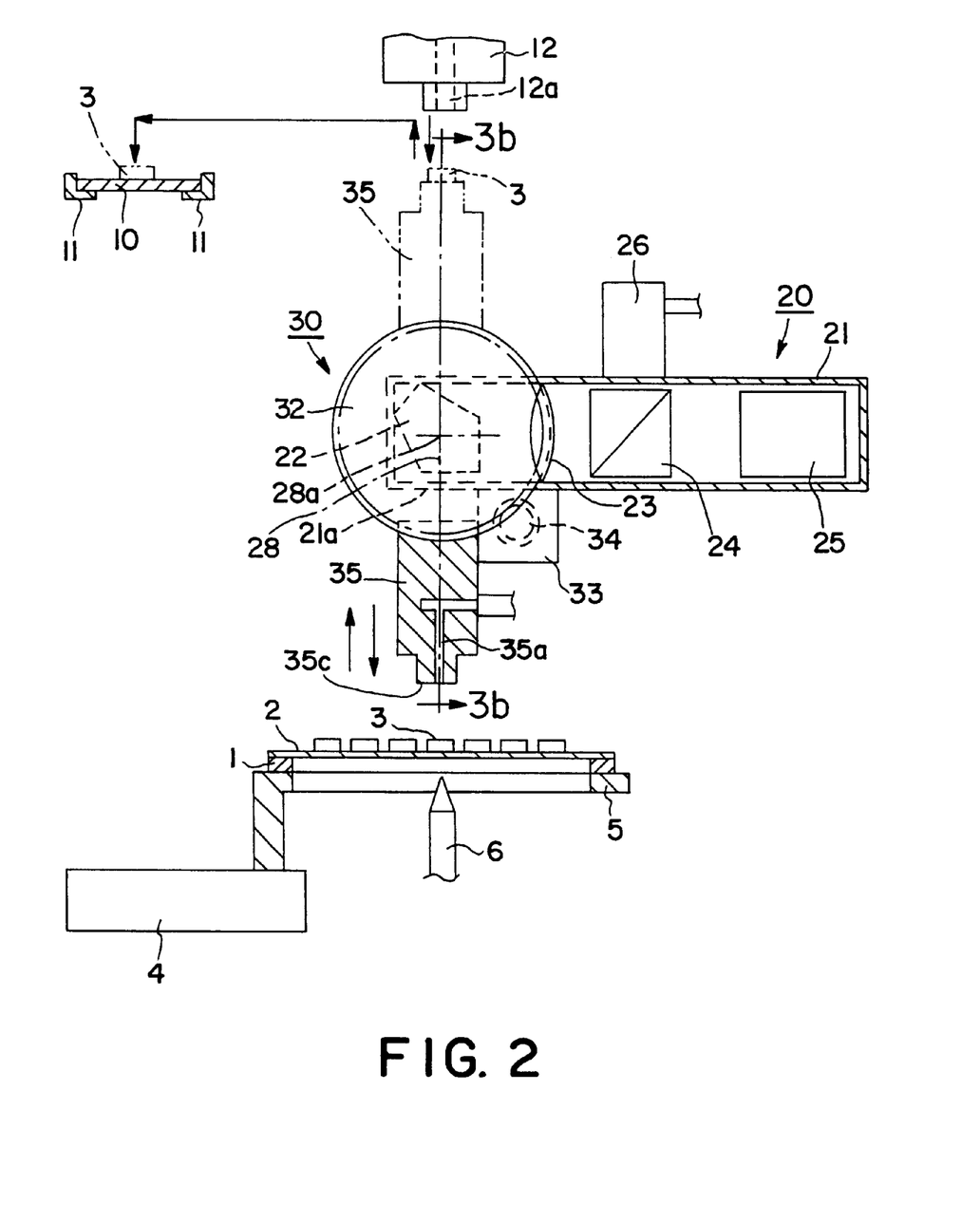
FIG. 2 is a longitudinal cross-sectional view showing the state in which the vacuum suction chucking nozzle rotates from the state shown in FIG. 1 so that the nozzle is positioned in the pick-up position that faces a die.

First, in the state shown in FIG. 1 and FIG. 3(a), the XY table 4 and wafer holder 5 are driven so that the die 3 that is to be picked up is positioned so as to be aligned with the optical axis 28. Then, the die 3 is recognized by the optical recognition device 20.

More specifically, light from the light source (not shown) is directed onto the die 3 via the optical fiber 27, illuminator 26, half-mirror 24, image-focusing lens 23, prism 22 and open window 21a. The image of the die 3 passes through the half-mirror 24 via the open window 21a, prism 22 and image-focusing lens 23 and is taken (or picked up) by the image pick-up element 25 and then converted into an electrical signal. This electrical signal is subjected to image processing and recognized by an electrical circuit (not shown), and finally any positional deviation amount of the die 3 is calculated.

Then, the XY table 4 and wafer holder 5 are driven so that the positional deviation of the die 3 is corrected; in other words, the XY table 4 and wafer holder 5 are driven so that the center of the die 3 (which is to be picked up) in the horizontal direction is aligned with the optical axis 28.

While the die is thus being recognized and the positional deviation is being calculated, the driving source 33 is driven. The rotation of the output shaft of the driving source 33 is transmitted to the gears 32 by the gears 34; and by way of the rotation of the gears 32, the vacuum suction chucking nozzle 35 is rotated downward as shown in FIGS. 2 and 3(b). As a result, the vacuum suction part 35c of the vacuum suction chucking nozzle 35 is positioned in the pick-up position that faces the die 3.

Next, the main body 21 of the optical recognition device 20 is lowered by a vertical driving means (not shown). At the same time that the vacuum suction part 35c of the vacuum suction chucking nozzle 35 approaches the die 3, the vacuum suction chucking nozzle electromagnetic valve (not shown) is opened, so that a supply of vacuum to the vacuum suction hole 35a of the vacuum suction chucking nozzle 35 is initiated. In addition, the push-up pin 6 is raised by a vertical driving means (not shown), and the die 3 is pushed upward thereby. As a result, the vacuum suction chucking nozzle 35 holds the die 3 by vacuum suction and picks up the die 3 from the wafer sheet 2. Then, the main body 21 of the optical recognition device 20 is raised and returned to its original position.

Next, the driving source 33 is driven in the opposite direction from the direction previously described above, so that the vacuum suction chucking nozzle 35 is caused to undergo reverse rotation in an upward direction via the gears 32 and 34. As a result, the vacuum suction chucking nozzle 35 assumes the posture indicated by the two-dot chain line in FIG. 2; and the die 3 held by the vacuum suction chucking nozzle 35 via vacuum suction is positioned in a transfer position that faces the waiting bonding nozzle 12.

When the bonding nozzle 12 is driven and lowered by the vertical driving means (not shown) so that the bonding nozzle 12 approaches the die 3, the bonding nozzle electromagnetic valve (not shown) is opened, and the supply of a vacuum to the vacuum suction hole 12a of the bonding nozzle 12 is initiated. Furthermore, the vacuum suction chucking nozzle electromagnetic valve (not shown) is closed so that the supply of vacuum to the vacuum suction hole 35a of the vacuum suction chucking nozzle 35 is stopped. As a result, the die 3 is transferred from the vacuum suction chucking nozzle 35 to the bonding nozzle 12.

Next, the bonding nozzle 12 is raised; and it is driven by the XY table (not shown) so that the bonding nozzle 12 is moved to a point above the positioned substrate 10. The bonding nozzle 12 is lowered, and the die 3 is bonded to the substrate 10.

After the bonding is completed, the bonding nozzle electromagnetic valve (not shown) is closed so that the supply of vacuum to the vacuum suction hole 12a of the bonding nozzle 12 is stopped, and the bonding nozzle 12 is moved back to the position shown in FIG. 1 by performing a reverse movement that is opposite to the movement described above.

As described above, when the pick-up of the die 3 by the vacuum suction chucking nozzle 35 from the wafer sheet 2 is completed, the XY table 4 and wafer holder 5 are driven so that the next die 3 that is to be picked up is positioned on the optical axis 28. As also described above, when the vacuum suction chucking nozzle 35 that holds the die 3 by vacuum suction is rotated upward so that the vacuum suction chucking nozzle 35 is no longer beneath the open window 21a of the optical recognition device 20, the die 3 is recognized by the optical recognition device 20. After this, the positional deviation of the die 3 is calculated by the optical recognition device 20 as described above, and the XY table 4 and wafer holder 5 are driven so that the positional deviation of the die 3 is corrected.

Furthermore, when the transfer of the die 3 from the vacuum suction chucking nozzle 35 to the bonding nozzle 12 is done, and the image pick-up of the die 3 is completed, then the driving source 33 is operated, and the vacuum suction chucking nozzle 35 is rotated downward. In this way, an operation in which the vacuum suction part 35c of the vacuum suction chucking nozzle 35 faces the next die 3 that is to be picked up is performed. The recognition of the picked-up image of the die 3 and the calculation of the amount of positional deviation are performed at the same time during the rotation of the vacuum suction chucking nozzle 35.

As seen from the above, the die inverting device 30 is mounted on the optical recognition device 20 so that the vacuum suction chucking nozzle 35 is rotated in the direction of the die pick-up position and in the direction of the die transfer position, where the die is transferred to the bonding nozzle 12, in the outside area that corresponds to the open window 21a of the optical recognition device 20. Accordingly, the bonding apparatus can be made compact. Also, the optical recognition device 20 can recognize the die 3 to be picked up without being moved horizontally. Accordingly, the precision with which the positional deviation of the die 3 is recognized is improved. Moreover, the recognition operation of the die 3 is immediately initiated when the vacuum suction chucking nozzle 35 is rotated by the die inverting device 30. Accordingly, the time required for offset movement is reduced, and the overall bonding time can be shortened, thus improving productivity.

Figure 5:
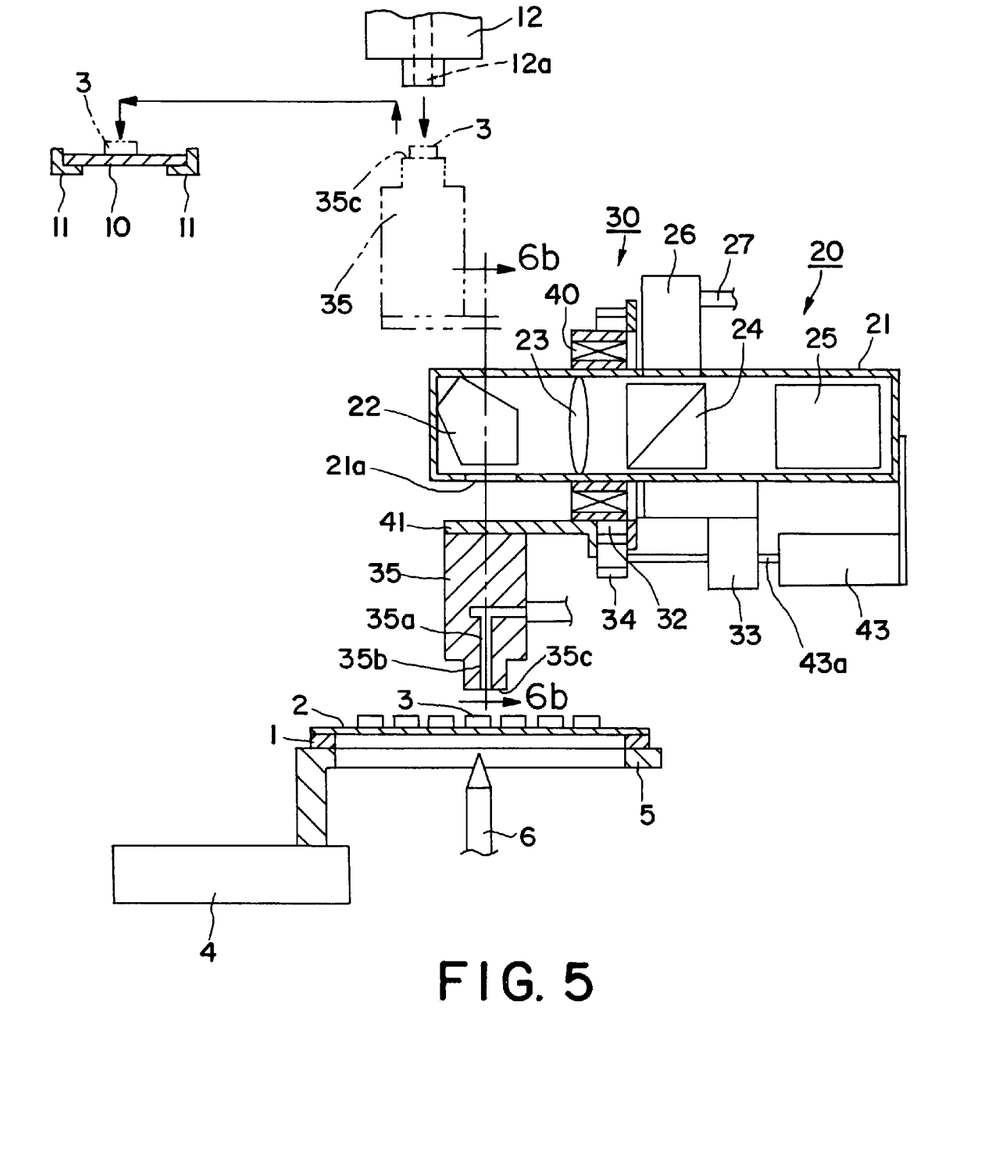
FIG. 5 is a longitudinal cross-sectional view showing the state in which the vacuum suction chucking nozzle rotates from the state shown in FIG. 4 so that the nozzle is positioned in the pick-up position that faces a die.
Figure 6A:
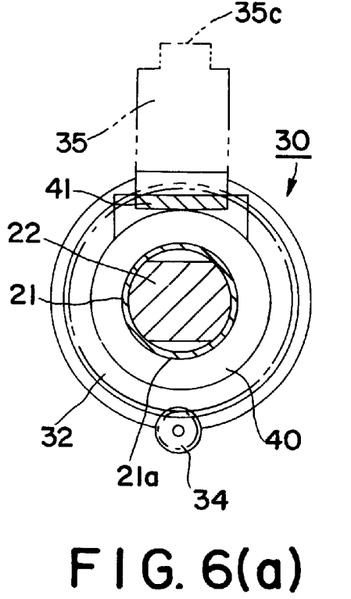
FIG. 6(a) is a cross-sectional view taken along the line 6a—6a in FIG. 4.
Figure 6B:
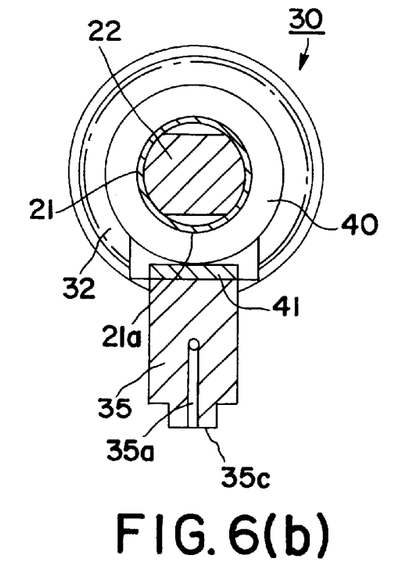
FIG. 6(b) is a cross-sectional view taken along the line 6b—6b in FIG. 5.

Next, the second embodiment of the present invention will be described with reference to FIGS. 4 through 6. Constituting elements which are the same as those in FIGS. 1 through 3 or which correspond to such elements are labeled with the same reference numerals, and a description of such elements is omitted.

In this second embodiment, the main body 21 of the optical recognition device 20 has a circular cylindrical shape, and the structure of the die inverting device 30 differs from that of the first embodiment. Below, only the constructions that are different from the first embodiment will be described.

A vacuum suction chucking nozzle holder 41 is installed on the main body 21 of the optical recognition device 20 via a slider 40 so that the vacuum suction chucking nozzle holder 41 is rotatable and slidable on the optical recognition device 20. The vacuum suction chucking nozzle 35 is provided on this vacuum suction chucking nozzle holder 41. A gear 32 is provided on the outer ring of the slider 40, and a ring-form stopper 42 is fixed to this outer ring of the slider 40. A driving source 33 is slidably mounted on the undersurface of the main body 21 of the optical recognition device 20, and a gear 34 coupled to the output shaft of the driving source 33 engages with the gear 32. The operating rod 43a of a cylinder 43 which is fastened to the undersurface of the main body 21 of the optical recognition device 20 is connected to the driving source 33.

The operation of this second embodiment will be described below.

Figure 4:
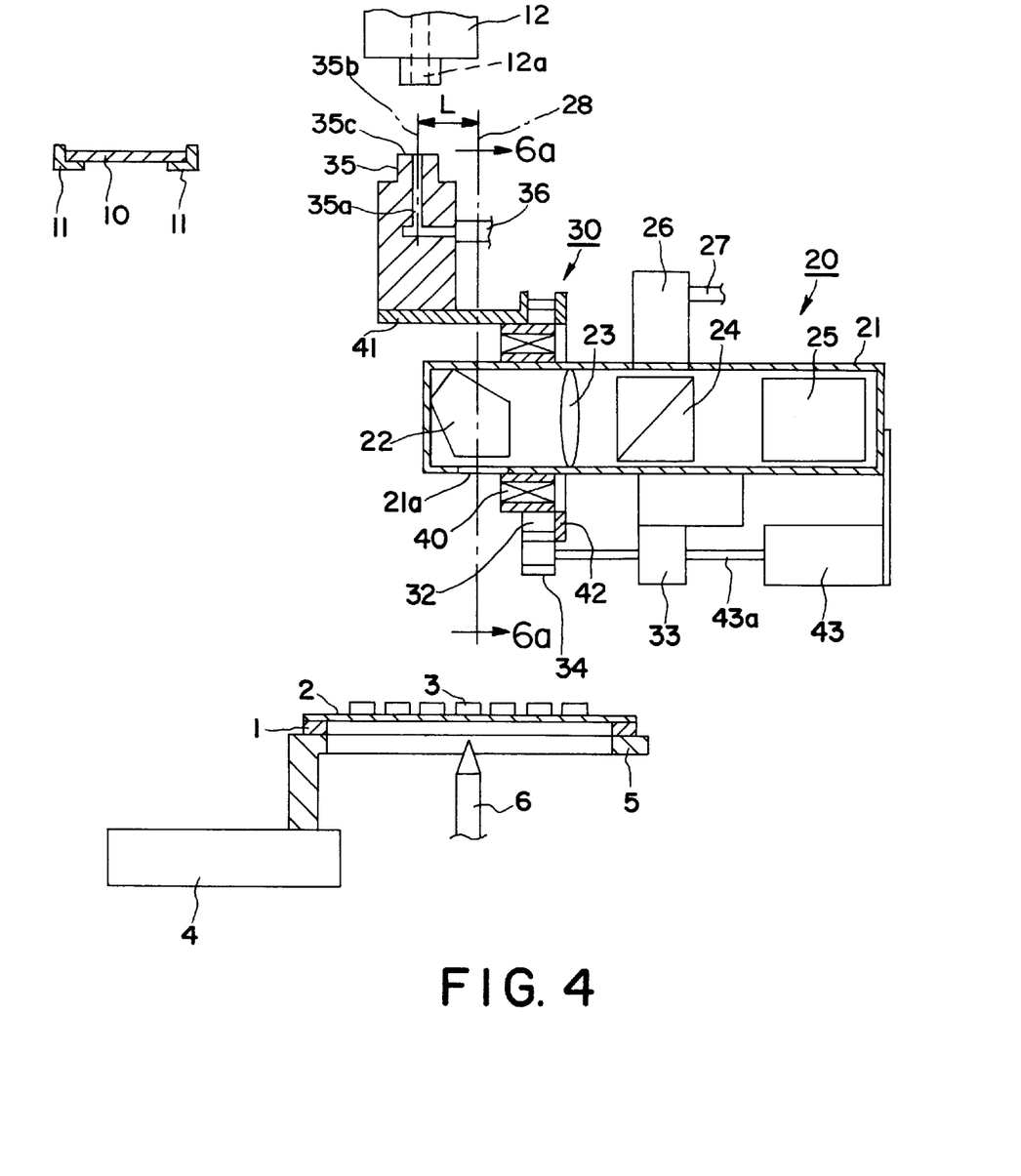
FIG. 4 is a longitudinal cross-sectional view of the flip-chip bonding apparatus according to the second embodiment of the present invention.

In the state shown in FIG. 4, the axial center 35b of the vacuum suction chucking nozzle 35 is offset by a distance of L from the optical axis 28 of the optical recognition device 20. The positional deviation of the die 3 that is to be picked up is recognized by the optical recognition device 20 in the same manner as in the first embodiment. After this, the XY table 4 and wafer holder 5 are driven so that the positional deviation of the die 3 is corrected.

Next, the driving source 33 is operated so as to rotate the gear 34. The cylinder 43 is also operated so that the operating rod 43 is retracted. When the gear 34 is rotated, the vacuum suction chucking nozzle 35 is rotated via the slider 40, so that vacuum suction part 35c of the vacuum suction chucking nozzle 35 faces downward. When the operating rod 43a is retracted as described above, the driving source 33 is moved together with the operating rod 43a, the gear 34 pulls the stopper 42, and the slider 40 and vacuum suction chucking nozzle 35 are both moved in the same direction (to the right in FIG. 4). As a result, the axial center 35b of the vacuum suction chucking nozzle 35 coincides with the optical axis 28, and the vacuum suction part 35c of the vacuum suction chucking nozzle 35 is positioned in the pick-up position that faces the die 3.

Then, as in the first embodiment, the main body 21 of the optical recognition device 20 is lowered so that the vacuum suction chucking nozzle 35 approaches the die 3. At the same time, the supply of vacuum to the vacuum suction hole 35a of the vacuum suction chucking nozzle 35 is initiated, and the push-up pin 6 is raised to push up the die 3. As a result, the vacuum suction chucking nozzle 35 holds the die 3 by vacuum suction and picks the die 3 up from the wafer sheet 2. The main body 21 of the optical recognition device 20 is then raised and returned to its original position.

Next, the driving source 33 is rotated in the opposite direction from the direction described above, and the operating rod 43a of the cylinder 43 protrudes. Thus, the vacuum suction chucking nozzle 35 undergoes reverse rotation in an upward direction and moved to the position indicated by the two-dot chain line in FIG. 5, in which the vacuum suction chucking nozzle 35 is offset from the optical axis 28 by a distance of L. As a result, the die 3 held by the vacuum suction chucking nozzle 35 via vacuum suction is positioned in the transfer position that faces the waiting bonding nozzle 12.

As in the first embodiment, the bonding nozzle 12 is lowered so that the nozzle approaches the die 3. The supply of vacuum to the vacuum suction hole 12a of the bonding nozzle 12 is initiated, and the supply of vacuum to the vacuum suction hole 35a of the vacuum suction chucking nozzle 35 is stopped. Thus, the die 3 is transferred from the vacuum suction chucking nozzle 35 to the bonding nozzle 12. Then, the bonding nozzle 12 is raised, moved to a point above the substrate 10, and lowered, thus bonding the die 3 to the substrate 10.

As seen from the above, the die inverting device 30 of the second embodiment is installed on the optical recognition device 20 so that the vacuum suction chucking nozzle 35 can be rotated and moved horizontally on the optical recognition device 20 in the direction of the die pick-up position and in the direction of the die transfer position in the outside area that correspond to the open window 21a of the optical recognition device 20. Accordingly, the bonding apparatus can be more compact as in the first embodiment. Also, the optical recognition device 20 can recognize the die 3 to be picked up without being moved horizontally. Accordingly, the positioning precision of the optical recognition device 20 is improved. Moreover, the recognition operation of the die 3 is performed immediately when the vacuum suction chucking nozzle 35 is rotated by the die inverting device 30. Accordingly, the time required for offset movement is reduced, and the overall bonding time can be shortened, thus improving productivity as in the first embodiment.

Figure 7:
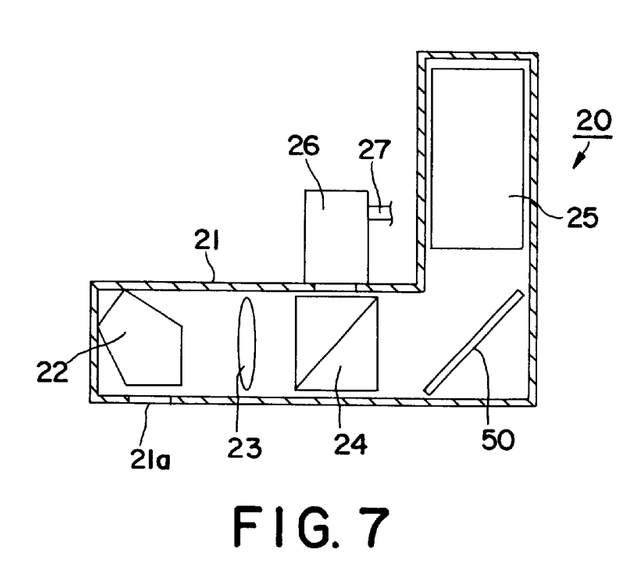
FIG. 7 is a cross-sectional view showing another type of the optical recognition device.

FIG. 7 shows an optical recognition device 20 modified from that used in the first and second embodiments.

More specifically, in this optical recognition device 20 of FIG. 7, a mirror 50 is installed on one side (to the right in FIG. 7) of the half-mirror 24, and the image pick-up element 25 is installed above the mirror 50. The remaining structure is the same as in the optical recognition device 20 described with reference to the first and second embodiments.

With this structure in which the mirror 50 and the image pick-up element 25 are provided in a vertical relationship, it is possible to shorten the lateral (horizontal) length of the optical recognition device 20, and the space can be used more effectively. In this optical recognition device 20, the image of the die 3 is inverted by the mirror 50. Accordingly, the positional deviation amount of the die 3 is calculated by way of a means that can compensate for this inversion.

In the optical recognition devices 20 described above, a pentagonal prism is used as the prism 22 installed above the open window 21a as seen from FIGS. 1, 2, 4, 5 and 7. It is also possible to use a roof prism instead of a pentagonal prism or to use a combination of such prisms with other optical elements. However, in the pentagonal prism, the number of times that light is reflected is large, and therefore, the light path length tends to increase. Accordingly, when the pentagonal prism is used as the prism 22, it is preferable that the image-focusing lens 23 is installed near the prism 22, thus reducing the size of the optical recognition device 20.

Next, the third embodiment of the present invention will be described with reference to FIGS. 8 through 11. Constituting elements which are the same as those in the previous embodiments or which correspond to those in the previous embodiments are labeled with the same reference numerals, and a detailed description of such elements is omitted.

Figure 8:
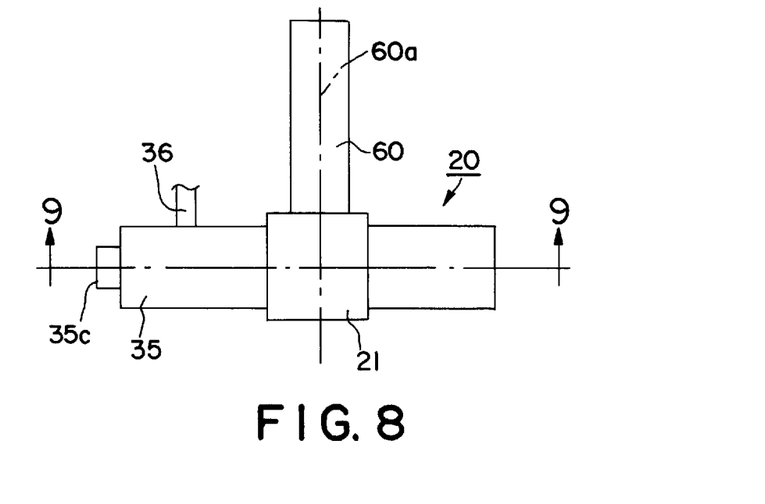
FIG. 8 is a top view of the flip-chip bonding apparatus according to the third embodiment the present invention.

In the previous embodiments, the vacuum suction chucking nozzle 35 is rotatably mounted on the main body 21 of the optical recognition device 20. In the third embodiment, however, the vacuum suction chucking nozzle 35 is fixed to the main body 21 of the optical recognition device 20, and the main body 21 is rotated. The remaining constituent elements are the same as in the previous embodiments.

Figure 9:
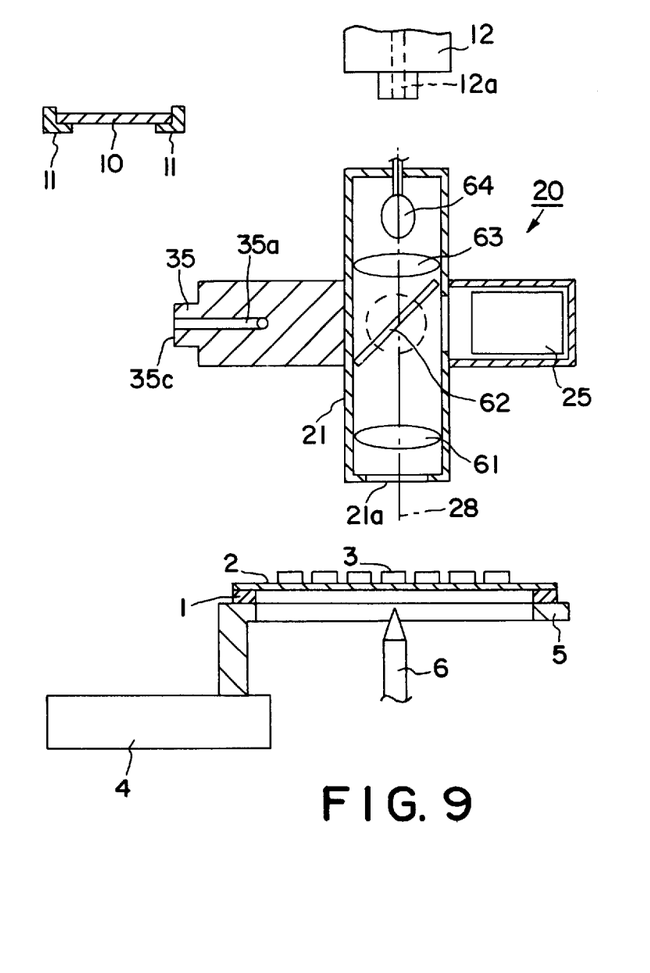
FIG. 9 is a cross-sectional view taken along the line 9—9 in FIG. 8.

More specifically, the optical recognition device 20 is provided on a rotating shaft 60, and the rotating shaft 60 is rotated about its axial center 60a by a rotary driving means (not shown). Inside the main body 21 of the optical recognition device 20, an image-focusing lens 61, a half-mirror 62, an illumination lens 63, and a light source 64 consisting of a light-emitting diode, a halogen lamp, etc. are installed in that order from the open window 21a. In addition, an image pick-up element 25 is installed beside the half-mirror 62.

In operation, in the state shown in FIG. 9, the XY table 4 and wafer holder 5 are first driven so that the die 3 that is to be picked up is positioned on the optical axis 28, and this die 3 is recognized by the optical recognition device 20. In other words, light from the light source 64 passes through the image-focusing lens 61 from the illumination lens 63 and half-mirror 62, and then it irradiates the die 3 via the open window 21a. The image of the die 3 is taken (or picked up) by the image pick-up element 25 via the open window 21a, image-focusing lens 61 and half-mirror 62, and then it is converted into an electrical signal. This electrical signal is subjected to image processing and recognized by an electrical circuit (not shown), and the amount of positional deviation of the die 3 is ultimately calculated. Then, the XY table 4 and wafer holder 5 are driven so as to correct the positional deviation of the die 3; in other words, the XY table 4 and wafer holder 5 are driven so that the center of the die 3 (that is to be picked up) with respect to the horizontal direction is aligned with the optical axis 28.

Figure 10:
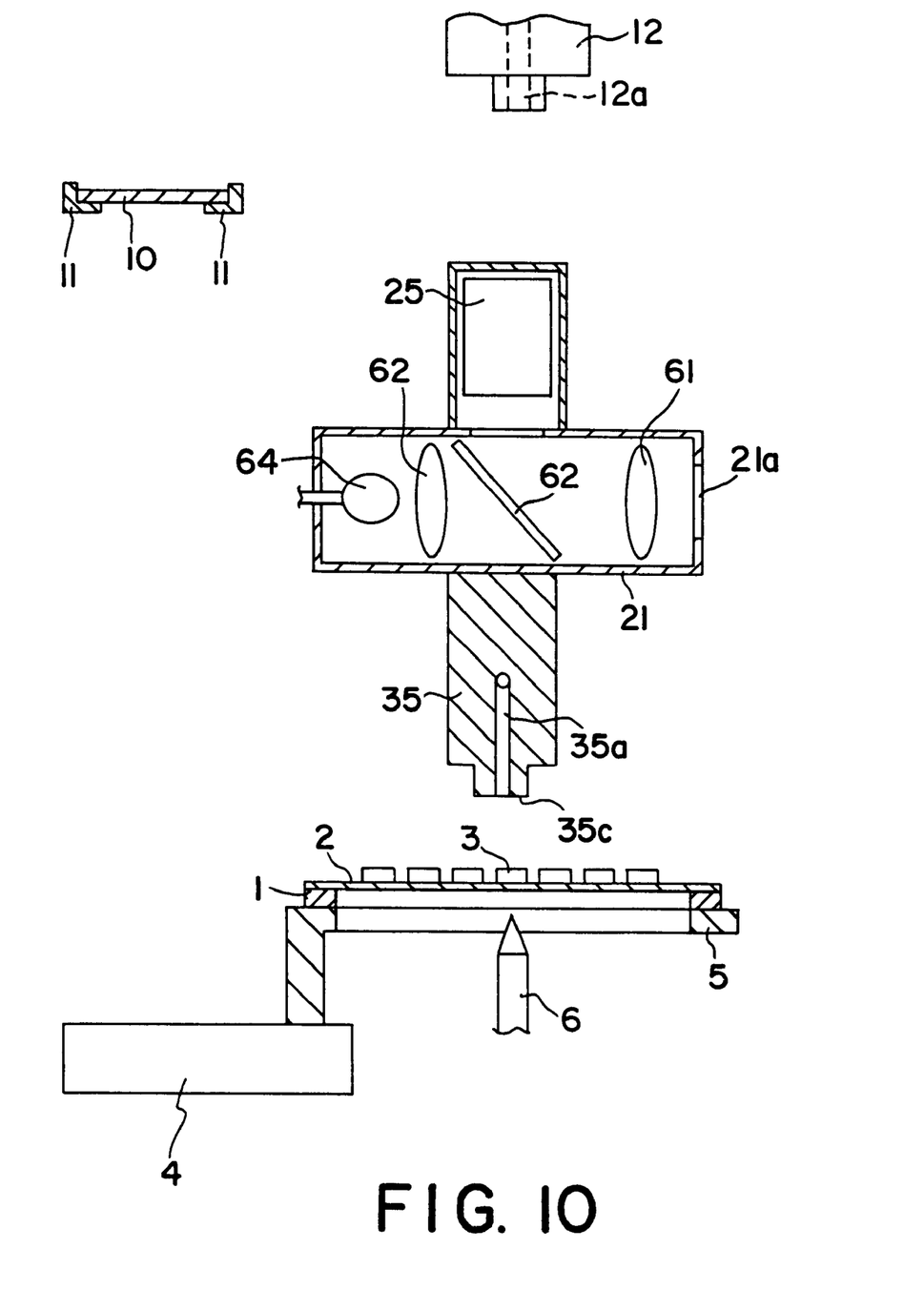
FIG. 10 is a cross-sectional view showing the state in which the rotating shaft rotates from the state shown in FIG. 9 so that the vacuum suction chucking nozzle is positioned in the pick-up position that faces a die.

Then, the rotating shaft 60 is rotated while the die 3 is being recognized and the amount of positional deviation is being calculated. When the optical recognition device 20 is rotated together with the rotating shaft 60, the optical recognition device 20 is positioned so that the vacuum suction part 35c of the vacuum suction chucking nozzle 35 is at the die pick-up position that faces the die 3 as shown in FIG. 10. Then, the rotating shaft 60 is lowered by a vertical driving means (not shown). At the same time that the vacuum suction part 35c of the vacuum suction chucking nozzle 35 approaches the die 3, the supply of vacuum to the vacuum suction hole 35a of the vacuum suction chucking nozzle 35 is initiated, and the push-up pin 6 is raised by a vertical driving means (not shown) so as to push up the die 3. As a result, the vacuum suction chucking nozzle 35 holds the die 3 by vacuum suction and picks the die 3 up from the wafer sheet 2. Then, the rotating shaft 60 is raised, and the main body 21 of the optical recognition device 20 is returned to its original position.

Figure 11:
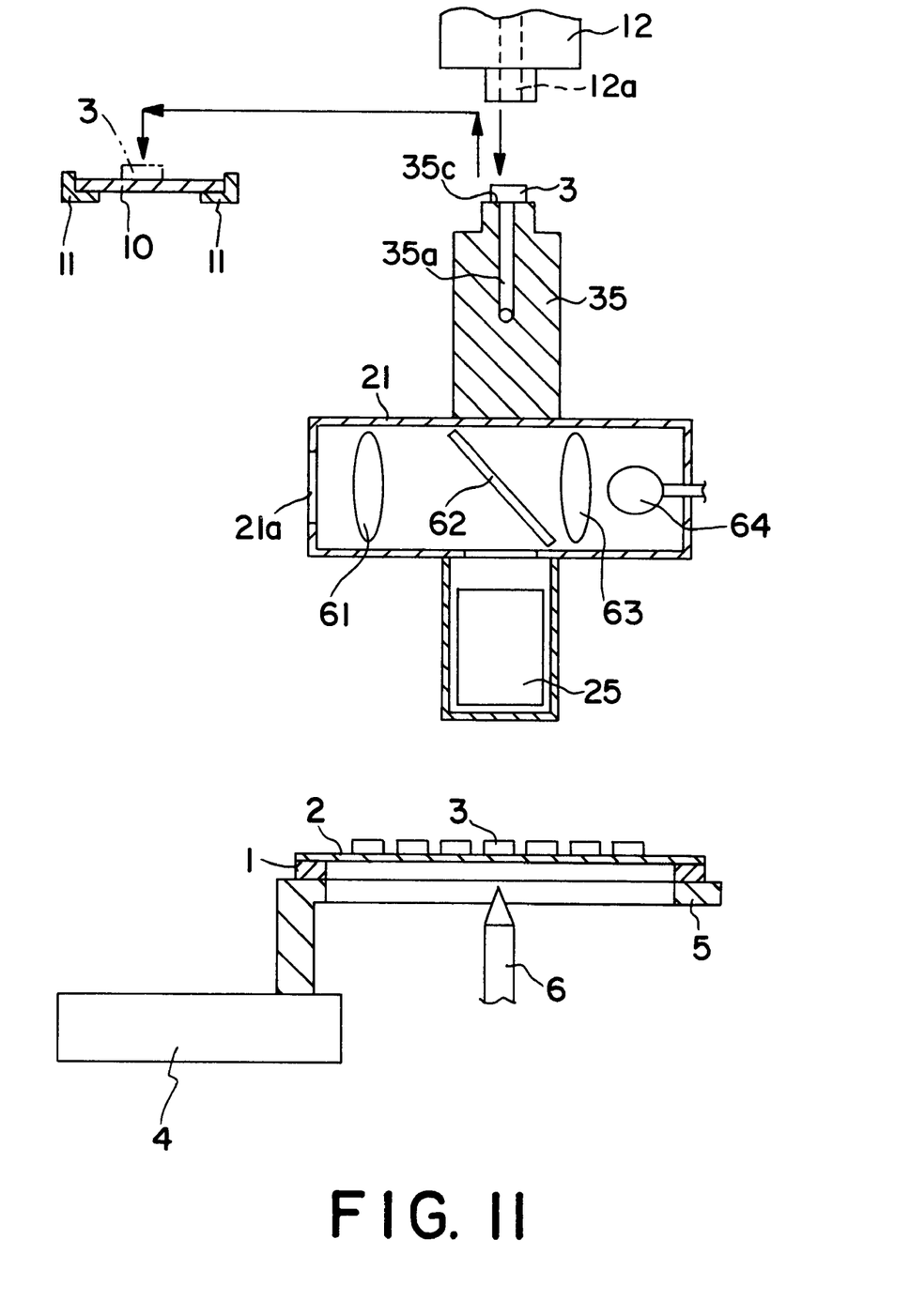
FIG. 11 is a cross-sectional view showing the state in which the rotating shaft rotates from the state shown in FIG. 10 so that the vacuum suction chucking nozzle is positioned in the transfer position that faces a bonding nozzle.

Next, the rotating shaft 60 is rotated, and the vacuum suction chucking nozzle 35 is rotated so as to be positioned as shown in FIG. 11. As a result, the die 3 held by the vacuum suction chucking nozzle 35 via vacuum suction is set to be the die transfer position that faces the waiting bonding nozzle 12.

After this, in the same manner as in the previous embodiments, the bonding nozzle 12 is lowered and approaches the die 3, and the supply of vacuum to the vacuum suction hole 12a of the bonding nozzle 12 is initiated. Also, the supply of vacuum to the vacuum suction hole 35a of the vacuum suction chucking nozzle 35 is stopped. As a result, the die 3 is transferred from the vacuum suction chucking nozzle 35 to the bonding nozzle 12.

When the transfer of the die 3 from the vacuum suction chucking nozzle 35 to the bonding nozzle 12 is thus completed, the rotating shaft 60 is rotated so that the open window 21a of the optical recognition device 20 faces the die 3 that is to be picked up. At the same time as this operation, when the die 3 is picked up from the wafer sheet 2 by the vacuum suction chucking nozzle 35, the XY table 4 and wafer holder 5 are driven so that the die 3 that is to be picked up next is positioned on the optical axis 28. Also, the bonding nozzle 12 is raised, moved to a point above the substrate 10 and lowered, thus bonding the die 3 to the substrate 10.

As seen form the above, in this third embodiment, the vacuum suction chucking nozzle 35 is provided on the optical recognition device 20 so that the vacuum suction chucking nozzle 35 is positioned within the plane of rotation of the open window 21a of the optical recognition device 20. Accordingly, the size of the bonding apparatus can be reduced in the same manner as in the previous embodiments. In addition, since the optical recognition device 20 recognizes the die 3 to be picked up without being moved horizontally, the positioning precision of the optical recognition device is improved. In the third embodiment, the optical recognition device 20 is provided so as to be rotatable, whereas the optical recognition devices 20 of the previous embodiments are not rotatable. Accordingly, the positioning precision of the optical recognition device of the third embodiment might be slightly inferior to that of the previous embodiments; however, it is still superior to that of prior art devices.

Furthermore, in the respective embodiments described above, the die 3 positioned on a wafer sheet 2 with the bumps thereof facing upward is picked up and held by a vacuum suction chucking nozzle 35 via vacuum suction. However, it goes without saying that the present invention is applicable to the case where a die 3 is placed on a tray and picked up and held by a vacuum suction chucking nozzle 35 via vacuum suction.

As seen from the above, according to the present invention, the die inverting device on which the vacuum suction chucking nozzle is provided is mounted on the optical recognition device of a die bonding apparatus. Accordingly, the overall size of the bonding apparatus can be reduced. Also, since the optical recognition device recognizes a die, that is to be picked up, without making a horizontal movement, the precision of recognition of the amount of positional deviation of the die is high. Furthermore, since the die recognition operation is performed immediately when the vacuum suction chucking nozzle is rotated by the die inverting device, the overall bonding time can be shortened, thus improving productivity.

What is claimed is:

1. A flip-chip bonding apparatus comprising: a vacuum suction chucking nozzle for picking up and holding, by means of vacuum suction, a die disposed with bumps thereof facing upward; a die inverting device on which said vacuum suction chucking nozzle is provided, said die inverting device for rotating said vacuum suction chucking nozzle, that holds said die by vacuum suction, to a die pick-up position and to a die transfer position so that an upper surface and an undersurface of said die are inverted; and an optical recognition device which has an open window formed for recognizing an image of said die, wherein:
   said die inverting device is mounted on said optical recognition device so that said vacuum suction chucking nozzle is rotatable to said die pick-up position and to said die transfer position.

2. A flip-chip bonding apparatus comprising: a vacuum suction chucking nozzle which picks up and holds, by means of vacuum suction, a die disposed with bumps thereof facing upward; a die inverting device on which said vacuum suction chucking nozzle is provided, said die inverting device for rotating said vacuum suction chucking nozzle, that holds said die by vacuum suction, in a direction of a die pick-up position and in a direction of a die transfer position so that an upper surface and an undersurface of said die are inverted; and an optical recognition device which has an open window formed and recognizes an image of said die, wherein said bonding apparatus further comprises:

a rotating member which is installed on said optical recognition device so that said rotating member is rotatable in a vertical plane and is movable horizontally, and a driving means which is mounted on said optical recognition device so as to rotate said rotating member, and said vacuum suction chucking nozzle is provided on said rotating member so that, when said rotating member is rotated, said vacuum suction chucking nozzle positionally corresponds to said open window of said optical recognition device.

3. A flip-chip bonding apparatus comprising: a vacuum suction chucking nozzle for picking up and holding, by means of vacuum suction, a die disposed with bumps thereof facing upward; and an optical recognition device which has an open window formed in an undersurface thereof for recognizing an image of said die, wherein:

said optical recognition device is provided so that said open window of said optical recognition device is rotatable in a vertical plane, said vacuum suction chucking nozzle is provided on said optical recognition device so as to be positioned within a plane of rotation of said open window of said optical recognition device, and a driving means for rotating said optical recognition device is provided.

4. A flip-chip bonding apparatus comprising: a vacuum suction chucking nozzle for picking up and holding, by means of vacuum suction, a die disposed with bumps thereof facing upward; a die inverting device on which said vacuum suction chucking nozzle is provided, said die inverting device for rotating said vacuum suction chucking nozzle, that holds said die by vacuum suction, to a die pick-up position and to a die transfer position so that an upper surface and an undersurface of said die are inverted; and an optical recognition device which has an open window formed for recognizing an image of said die, wherein said bonding apparatus further comprises:

a rotating member which is installed on said optical recognition device so that said rotating member is rotatable in a vertical plane, and a driving means which is installed on said optical recognition device so as to rotate said rotating member; and said vacuum suction chucking nozzle is provided on said rotating member so that, when said rotating member is rotated, said vacuum suction chucking nozzle positionally corresponds to said open window of said optical recognition device.

5. The flip-chip bonding apparatus according to claim 4, wherein said rotating member comprises a first gear, and said driving means comprises a second gear that engages with said first gear and a driving source that rotates said second gear.

6. A flip-chip bonding apparatus comprising: a vacuum suction chucking nozzle which picks up and holds, by means of vacuum suction, a die disposed with bumps thereof facing upward; a die inverting device on which said vacuum suction chucking nozzle is provided, said die inverting device for rotating said vacuum suction chucking nozzle, that holds said die by vacuum suction, in a direction of a die pick-up position and in a direction of a die transfer position so that an upper surface and an undersurface of said die are inverted; and an optical recognition device which has an open window formed and recognizes an image of said die, wherein said bonding apparatus further comprises:

a slider which is provided on said optical recognition device so as to be rotatable and horizontally movable, and a driving means which is installed on said optical recognition device so as to cause said slider to rotate and to move horizontally; and wherein said vacuum suction chucking nozzle is provided on said slider, and by way of said driving means said vacuum suction chucking nozzle is rotated in said direction of a die pick-up position and in said direction of a die transfer position and is caused to positionally correspond to said open window of said optical recognition device.

7. The flip-chip bonding apparatus according to claim 6, wherein said driving means comprises a first gear which is provided on said slider, a second gear which engages with said first gear, a first driving source which is installed on said optical recognition device so as to be horizontally movable and to rotate said second gear, and a second driving source which is installed on said optical recognition device so as to move said first driving source horizontally.

* * * * *